United States Patent
Sutardja

(10) Patent No.: US 8,564,091 B2
(45) Date of Patent: Oct. 22, 2013

(54) DIE-TO-DIE ELECTRICAL ISOLATION IN A SEMICONDUCTOR PACKAGE

(75) Inventor: Sehat Sutardja, Los Altos Hills, CA (US)

(73) Assignee: Marvell World Trade Ltd., S. Michael (BB)

( * ) Notice: Subject to any disclaimer, the term of this patent is extended or adjusted under 35 U.S.C. 154(b) by 350 days.

(21) Appl. No.: 12/817,944

(22) Filed: Jun. 17, 2010

(65) Prior Publication Data

US 2011/0001587 A1 Jan. 6, 2011

Related U.S. Application Data

(60) Provisional application No. 61/223,325, filed on Jul. 6, 2009.

(51) Int. Cl.
*H01L 27/08* (2006.01)
*H04B 1/18* (2006.01)
*H04B 17/00* (2006.01)

(52) U.S. Cl.
USPC ............ 257/531; 257/E23.169; 455/280; 455/292; 455/67.15

(58) Field of Classification Search
USPC .......... 257/531, 734, E23.169; 375/257–258; 333/24 R
See application file for complete search history.

(56) References Cited

U.S. PATENT DOCUMENTS

| | | | |
|---|---|---|---|
| 2003/0042571 A1* | 3/2003 | Chen et al. | 257/531 |
| 2008/0013635 A1* | 1/2008 | Dupuis | 375/258 |
| 2008/0173992 A1* | 7/2008 | Mahler et al. | 257/676 |

FOREIGN PATENT DOCUMENTS

CN 101212232 7/2008

* cited by examiner

*Primary Examiner* — Daniel Luke
*Assistant Examiner* — Khaja Ahmad

(57) ABSTRACT

Some of the embodiments of the present disclosure provide a semiconductor package comprising a first die; a second die; and an inductor arrangement configured to inductively couple the first die and the second die while maintaining electrical isolation between active circuit components of the first die and active circuit components of the second die. Other embodiments are also described and claimed.

20 Claims, 14 Drawing Sheets

DIE-TO-DIE ELECTRICAL ISOLATION IN A SEMICONDUCTOR PACKAGE

CROSS REFERENCE TO RELATED APPLICATIONS

The present application claims priority to U.S. Patent Application No. 61/223,325, filed Jul. 6, 2009, the entire specification of which is hereby incorporated by reference in its entirety for all purposes, except for those sections, if any, that are inconsistent with this specification.

TECHNICAL FIELD

Embodiments of the present invention relate to electrical circuits in general, and more specifically, to achieving die-to-die electrical isolation in a semiconductor package.

BACKGROUND

The background description provided herein is for the purpose of generally presenting the context of the disclosure. Work of the presently named inventor, to the extent it is described in this background section, as well as aspects of the description that may not otherwise qualify as prior art at the time of filing, are neither expressly nor impliedly admitted as prior art against the present disclosure.

FIG. 1 schematically illustrates a semiconductor package 100. The semiconductor package 100 includes a first die 108a and a second die 108b, both attached to a die frame 104. The first die 108a includes a plurality of die pads 110a, ..., 110f and the second die 108b includes a plurality of die pads 112a, ..., 112d.

The semiconductor package 100 includes a plurality of pins 116a, ..., 116e, electrically coupled to the plurality of die pads 110a, ..., 110e, respectively, using bond wires 124a, ..., 124e. The semiconductor package 100 also includes a plurality of pins 118a, ..., 118c, electrically coupled to the plurality of die pads 112a, ..., 112c, respectively, using bond wires 126a, ..., 126c. One or more pins (e.g., pins 120a and 120b) of the semiconductor package 100 may not be electrically coupled to any die pad 110a, ..., 110e.

In various applications, it may be desirable to transmit a signal from the first die 108a to the second die 108b, and/or from the second die 108b to the first die 108a. This is possible, for example, by electrically coupling die pad 110f of the first die 108a with the die pad 112d of the second die 108b using bond wire 128. Although not illustrated in FIG. 1, the die pads 110f and 112d may also be electrically coupled, using one or more bond wires, via one or more pins of the semiconductor package 100 (e.g., instead of or in addition to directly coupling the die pads 110f and 112d using bond wire 128).

In some applications, the two dies 108a and 108b may operate at different voltages. For example, the first die 108a may operate at a voltage that is relatively higher than an operating voltage of the second die 108b. In some of these applications (e.g., when a difference between the operating voltages of the two dies are relatively high), it may be desirable to electrically isolate the two dies. Accordingly, in these applications, it may not be desirable to electrically couple the two dies 108a and 108b. However, it is still desirable to transmit signals between the two dies 108a and 108b.

SUMMARY

In various embodiments, the present disclosure provides a semiconductor package comprising a first die; a second die; and an inductor arrangement configured to inductively couple the first die and the second die while maintaining electrical isolation between active circuit components of the first die and active circuit components of the second die.

In various embodiments, the present disclosure also provides a method of transmitting signals between a first die and a second die included in a semiconductor package, the method comprising providing an inductor arrangement that inductively couples the first die and the second die, while maintaining electrical isolation between active circuit components of the first die and active circuit components of the second die, wherein the inductor arrangement includes a first inductor circuit and a second inductor circuit; transmitting a first signal from the first die through the first inductor circuit such that a second signal is inductively generated in the second inductor circuit; and receiving the second signal in the second die, wherein the second signal is representative of the first signal.

BRIEF DESCRIPTION OF THE DRAWINGS

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use the phrases "in an embodiment," or "in embodiments," which may each refer to one or more of the same or different embodiments. The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Figure 1:
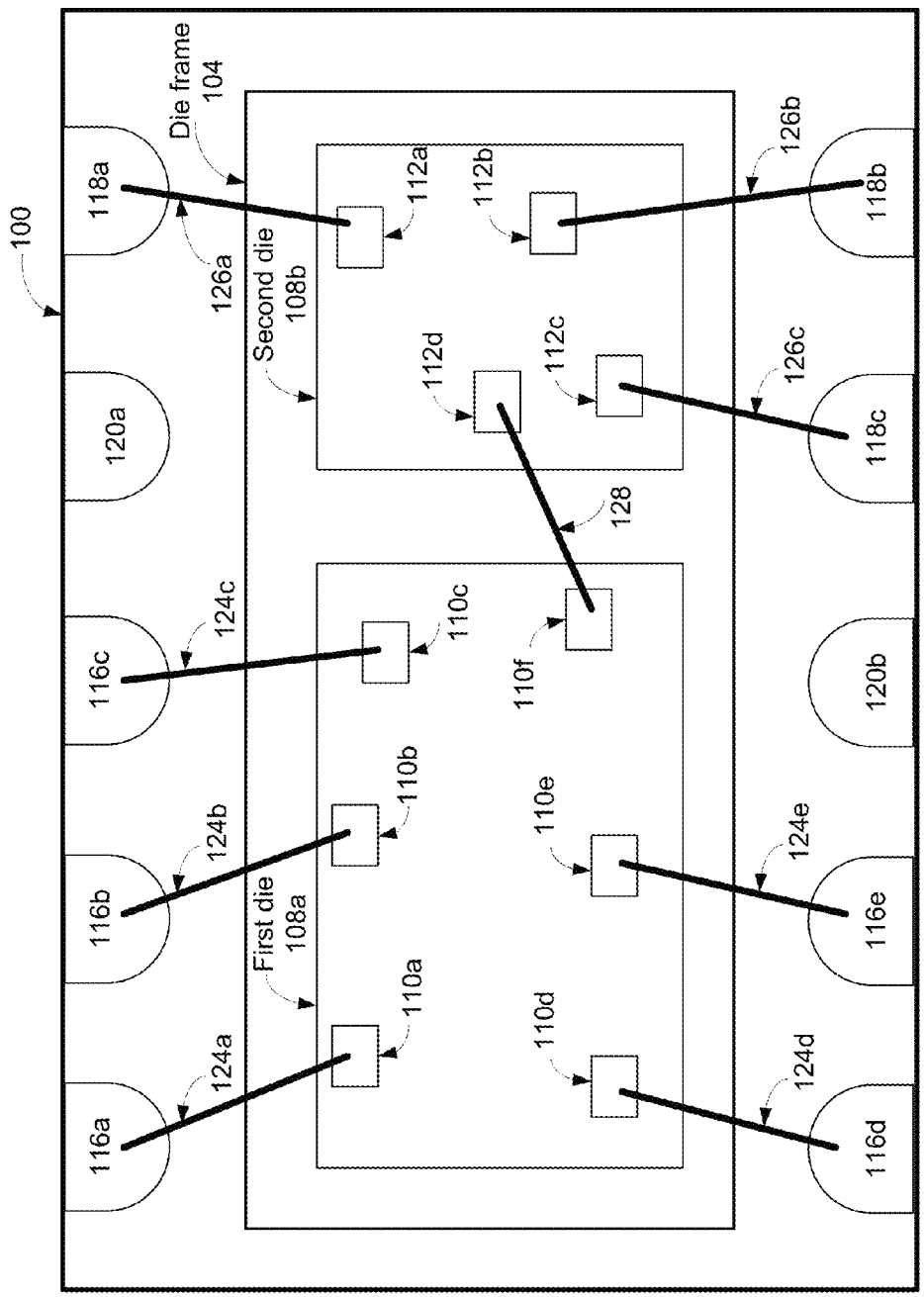
FIG. 1 schematically illustrates an exemplary semiconductor package.
Figure 2:
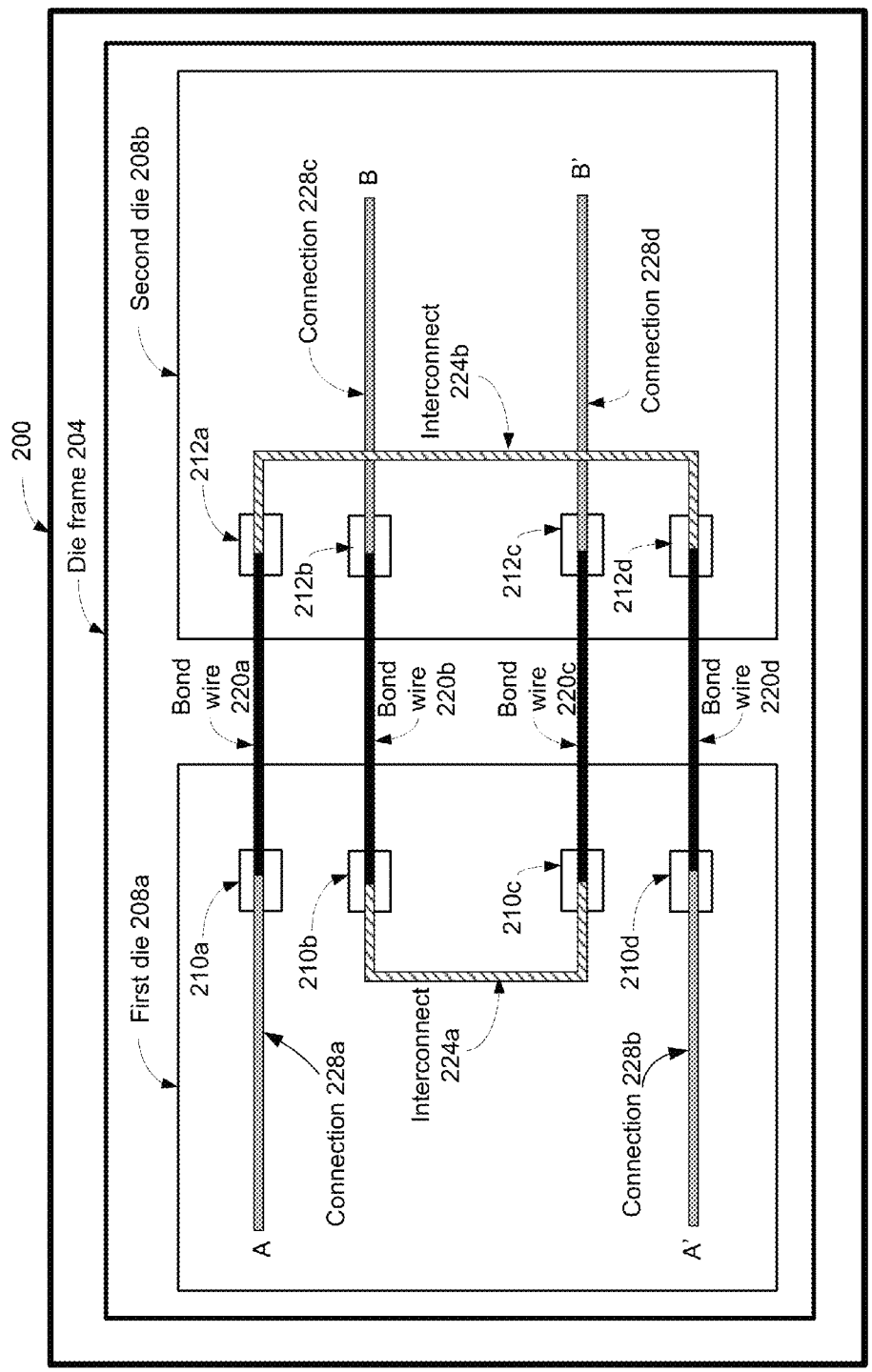
FIG. 2 schematically illustrates a semiconductor package, in accordance with various embodiments of the present disclosure.

FIG. 2 schematically illustrates a semiconductor package 200, in accordance with various embodiments of the present disclosure. The semiconductor package 200 includes a first die 208a and a second die 208b, both attached to a die frame 204.

Although the semiconductor package 200 includes one or more pins, one or more die pads in the dies 208a and 208b, and/or one or more bond wires coupling one or more die pads in the dies 208a and/or 208b to one or more pins, some of these components are not illustrated in FIG. 2 for the purpose of clarity and to avoid obfuscating teaching principles of the present disclosure.

The first die 208a includes a plurality of connectors 210a, 210b, 210c and 210d, and the second die 208b includes a plurality of connectors 212a, 212b, 212c and 212d. In various embodiments, each of the connectors 210a, 210b, 210c and 210d of the first die 208a are electrically coupled to corresponding connectors 212a, 212b, 212c and 212d of the second die 208b through respective bond wires 220a, 220b, 220c and 220d, as illustrated in FIG. 2. In various embodiments, the connectors 210a, . . . , 210d comprise die pads of the first die 208a, and the connectors 212a, . . . , 212d comprise die pads of the second die 208b.

The connectors 210b and 210c of the first die 208a are electrically coupled using an interconnect 224a, and the connectors 212a and 212d of the second die 208b are electrically coupled using an interconnect 224b. In FIG. 2, the interconnects (e.g., interconnects 224a and 224b) are illustrated using checkered lines for the purpose of clarity and to better distinguish the interconnects from various other components of the semiconductor package 200. The interconnects 224a and 224b comprise any suitable electrically conductive material, including, for example, any suitable metal interconnection or wires.

The first die 208a also includes terminals A and A'. The terminal A is electrically coupled to the connector 210a through a connection 228a, and the terminal A' is electrically coupled to the connector 210d through a connection 228b. The second die 208b also includes terminals B and B'. The terminal B is electrically coupled to the connector 212b through a connection 228c, and the terminal B' is electrically coupled to the connector 212c through a connection 228d. In FIG. 2, the connections 228a, . . . , 228d are illustrated using grey lines for the purpose of clarity and to better distinguish the connects from various other components of the semiconductor package 200. The connections 228a, . . . , 228d comprise any suitable electrically conductive material, e.g., any appropriate metal.

It should be noted that the connections 228c and 228d are electrically isolated from the interconnect 224b. For example, the connections 228c and 228d may lie in a plane of the second die 208b that is different from a plane in which the interconnect 224b lies, and the connections 228c and 228d may be electrically isolated from the interconnect 224b using any appropriate insulating material (not illustrated in FIG. 2).

Although not illustrated in FIG. 2, the first die 208a includes a plurality of active circuit components (e.g., one or more electrical components (e.g., logic gates, transistors, etc.), one or more metal layers associated with electrical component(s), die pads, any component that is configured to receive, transmit and/or process electrical signals, and/or the like). For the purpose of this disclosure and unless otherwise noted, it is assumed that the active circuit components of the first die 208a do not include the connectors 210a, . . . , 210d. Also, for the purpose of this disclosure and unless otherwise noted, as the interconnect 224a is not a part of the first die 208a, it is assumed that the active circuit components of the first die 208a do not include the interconnect 224a. Similarly, although not illustrated in FIG. 2, the second die 208b includes a plurality of active circuit components. For the purpose of this disclosure and unless otherwise noted, it is assumed that the active circuit components of the second die 208b do not include the connectors 212a, . . . , 212d. Also, for the purpose of this disclosure and unless otherwise noted, as the interconnect 224b is not a part of the second die 208b, it is assumed that the active circuit components of the second die 208b do not include the interconnect 224b.

Although not illustrated in FIG. 2, the terminals A and A' may be electrically coupled to one or more active circuit components of the first die 208a. Thus, the connections 228a and 228b, bond wires 220a and 220d, and the interconnect 224b are electrically coupled to one or more active circuit components of the first die 208a through terminals A and A'.

Although not illustrated in FIG. 2, the terminals B and B' may be electrically coupled to one or more active circuit components of the second die 208b. Thus, the connections 228c and 228d, bond wires 220b and 220c, and the interconnect 224a are electrically coupled to one or more active circuit components of the second die 208b through terminals B and B'.

The bond wires 220a and 220d, the connectors 212a and 212d, and the interconnect 224b are electrically isolated from the active circuit components of the second die 208b. For example, the interconnect 224b may be a floating wire in the second die 208b. Similarly, the bond wires 220b and 220c, the connectors 210b and 210c, and the interconnect 224a are electrically isolated from the active circuit components of the first die 208a. For example, the interconnect 224a may be a floating wire in the first die 208a.

Figure 3A:
FIGS. 3A and 3B schematically illustrate cross sectional views of a first die of the semiconductor package of FIG. 2, in accordance with various embodiments of the present disclosure.

FIG. 3A schematically illustrates a cross sectional view of the first die 208a of the semiconductor package 200 of FIG. 2, in accordance with various embodiments of the present disclosure. Also illustrated in FIG. 3A is the interconnect 224a of FIG. 2. The first die 208a is illustrated by dotted lines to clarify that, in various embodiments, the interconnect 224a may not be a part of the first die 208a. In the embodiments of FIG. 3A, the interconnect 224a is electrically isolated from active circuit components of the first die 208a. The first die 208a includes a Silicon Dioxide (SiO$_2$) layer 334, under which other layers and components 338 (e.g., one or more active circuit components) of the first die 208a are formed. To further electrically isolate the interconnect 224a from the active circuit components of the first die 208a, an insulating layer 330 is formed over the SiO$_2$ layer 334. The insulating layer 330 comprises any suitable electrically insulating material, e.g., a suitable type of polymide. Thus, the interconnect 224a is separated from the active circuit components of the first die 208a by at least the insulating layer 330 and the SiO$_2$ layer 334.

In various embodiments, the interconnect 224a is separated from other metal layers and active circuit components of the first die 208a by at least a first distance. The first distance is based in part on a breakdown voltage of the insulating layer 330 and the SiO$_2$ layer 334, and/or a voltage level of signals transmitted through the interconnect 224a. For example, the first distance may be determined such that the first distance is sufficient to prevent an electrical breakdown of the insulating layer 330 and the SiO$_2$ layer 334 while signals are being transmitted through the interconnect 224a. In various embodiments, the first distance may be equal to about 10 micron.

Although not illustrated in FIG. 3A, similar to the interconnect 224a, the interconnect 224b of the second die 208b is also electrically isolated from metal layers and active circuit components of the second die 208b at least using a suitable insulating layer and SiO$_2$ layer. The interconnect 224b is separated from other metal layers and active circuit components of the second die 208b by at least a second distance. The second distance is based in part on a breakdown voltage of the insulating layer and the SiO$_2$ layer in the second die 208b, and/or a voltage level of signals transmitted through the interconnect 224b. In various embodiments, the second distance may be equal to about 10 micron.

Figure 3B:
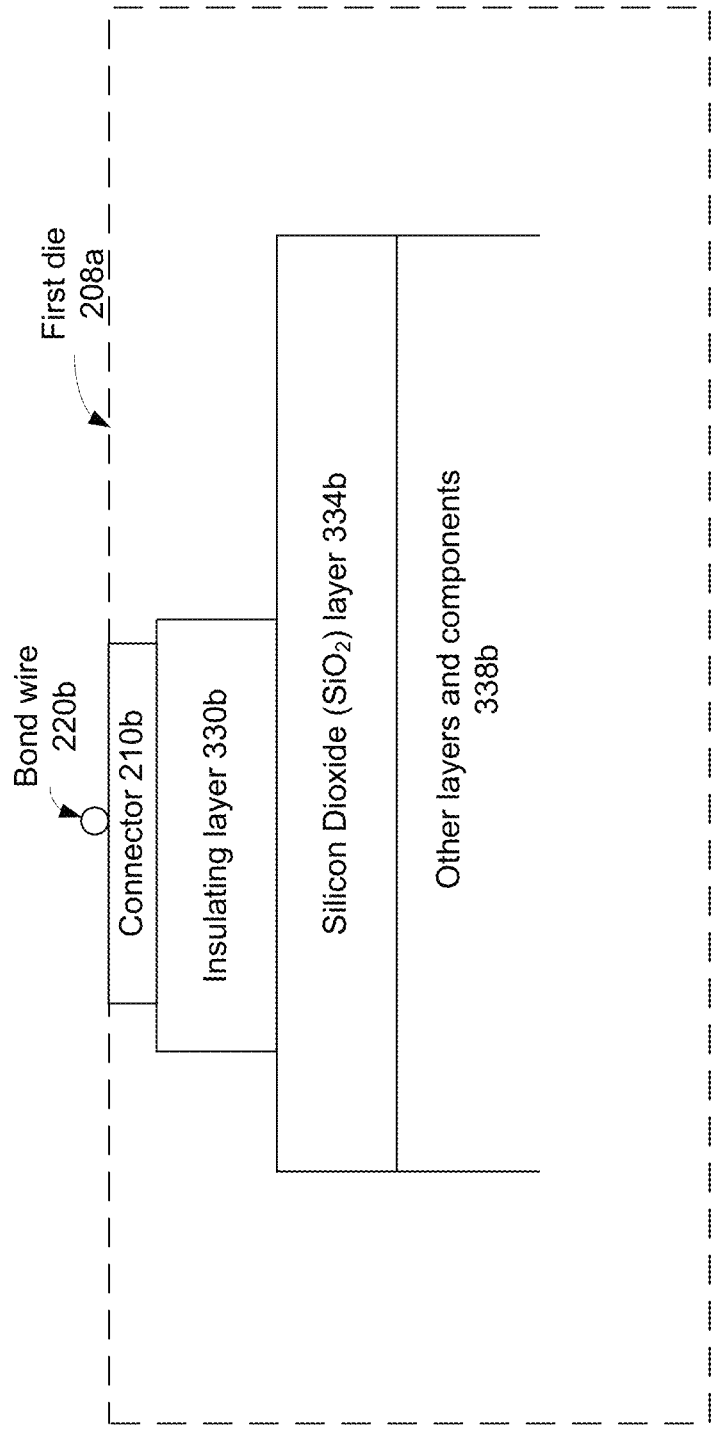

FIG. 3B schematically illustrates another cross sectional view of the first die 208a of the semiconductor package 200 of FIG. 2, in accordance with various embodiments of the present disclosure. Also illustrated in FIG. 3B is the bond wire 220b. The first die 208a is illustrated by dotted lines to clarify that, in various embodiments, the bond wire 220b may not be a part of the first die 208a. In the embodiments of FIG. 3B, the connector 210b is electrically isolated from active circuit components of the first die 208a. The first die 208a includes a SiO$_2$ layer 334b (which may be similar to the SiO$_2$ layer 334 of FIG. 3A), under which other layers and components 338b (e.g., one or more active circuit components) of the first die 208a are formed. To further electrically isolate the connector 210b from the active circuit components of the first die 208a, an insulating layer 330b is formed over the SiO$_2$ layer 334b. In various embodiments, the insulating layer 330b may be similar to the insulating layer 330 of FIG. 3A. Thus, the connector 210b is separated from one or more active circuit components of the first die 208a by at least the insulating layer 330b and the SiO$_2$ layer 334b. In various embodiments, the connector 210b is separated from other metal layers and active circuit components of the first die 208a by at least a third distance that is based in part on a breakdown voltage of the insulating layer 330b and the SiO$_2$ layer 334b, and/or a voltage level of signals transmitted through the connector 210b. For example, the third distance may be sufficient to prevent an electrical breakdown of the insulating layer 330b and the SiO$_2$ layer 334b while signals are being transmitted through the connector 201b. In various embodiments, the third distance may be equal to about 10 micron.

Similarly, the other connectors (e.g., connectors 210a, 210c, 210d, 212a, . . . , 212d) are separated from metal layers and active circuit components of the respective dies by at least respective minimum distances, which are based in part on a breakdown voltage of the respective insulating layers and the SiO$_2$ layers, and/or voltage levels of signals transmitted through the respective connectors.

Figure 4:
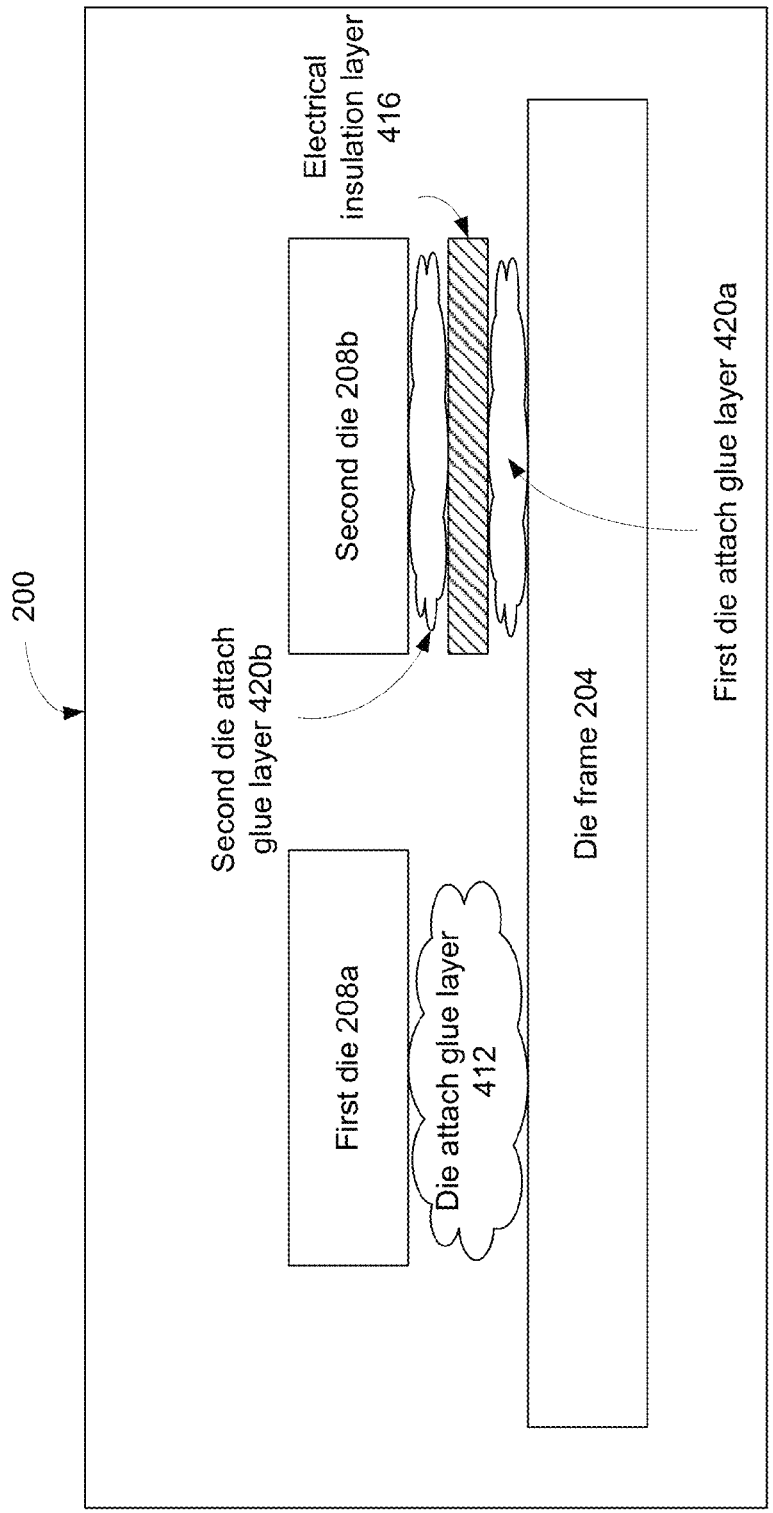
FIG. 4 schematically illustrates an attachment of a first die and a second die to a die frame of the semiconductor package of FIG. 2, in accordance with various embodiments of the present disclosure.

FIG. 4 schematically illustrates an attachment of the first die 208a and the second die 208b to the die frame 204 of the semiconductor package 200 of FIG. 2, in accordance with various embodiments of the present disclosure. FIG. 4 illustrates a cross sectional view of the semiconductor package 200. As illustrated in FIG. 4, the first die 208a is attached to the die frame 204 using a die attach glue layer 412. The second die 208b is attached to the die frame 204 using a first die attach glue layer 420a, an electrical insulation layer 416, and a second die attach glue layer 420b. Die attach glue layers 412, 420a and/or 420b are electrically and/or thermally conductive, and comprise any suitable die attach glue (e.g., silver adhesive paste). In various embodiments, the first die 208a is electrically coupled to the die frame 204 through electrically conductive die attach glue layer 412.

The electrical insulation layer 416 may be thermally conductive, but has relatively higher electrical resistance, thereby electrically isolating the second die 208b from the die frame 204. The electrical insulation layer 416 comprises any suitable electrically insulating material, such as glass or polymide.

Although not illustrated in FIG. 4, in various other embodiments, instead of using the first die attach glue layer 420a, the electrical insulation layer 416, and the second die attach glue layer 420b, the second die 208b may be attached to the die frame 204 using a die attach glue layer (e.g., comprising an epoxy resin) that is electrically nonconductive.

Referring to FIGS. 2 and 4, since the second die 208b is electrically isolated from the die frame 204 (e.g., because of the electrical insulation layer 416), the first die 208a and the second die 208b are not electrically coupled through the die frame 204. Furthermore, as previously described, the bond wires 220a and 220d, the connectors 212a and 212d, and the interconnect 224b of FIG. 2 are electrically isolated from the active circuit components of the second die 208b. Similarly, the bond wires 220b and 220c, the connectors 210b and 210c, and the interconnect 224a are electrically isolated from the active circuit components of the first die 208a. Accordingly, the active circuit components of the first die 208a and the active circuit components of the second die 208b are not electrically coupled through any of the bond wires 220a, . . . , 220d, the interconnects 224a and 224b, the connectors 210a, . . . , 210d, 212a, . . . , 212d and/or the connections 228a, . . . , 228d. Accordingly, the active circuit components of the first die 208a and the active circuit components of the second die 208b are not electrically coupled, either through the die frame 204 or through the bond wires 210a, . . . , 210d. That is, the active circuit components of the two dies 208a and 208b are electrically isolated.

Referring again to FIG. 2, in the semiconductor package 200, the bond wire 220a is placed proximally to the bond wire 220b, and the bond wire 220c is placed proximally to the bond wire 220d. In various embodiments, the bond wire 220a, the interconnect 224b and the bond wire 220d form a first inductor circuit. Similarly, the bond wire 220b, the interconnect 224a and the bond wire 220c form a second inductor circuit. Thus, the first inductor circuit is formed across terminals A and A', and the second inductor circuit is formed across terminals B and B'. In various embodiments, due to the close proximity of the bond wire 220a and bond wire 220b, and close proximity of the bond wire 220c and the bond wire 220d, an inductive coupling develops between the first inductor circuit and the second inductor circuit. The first inductor circuit and the second inductor circuit, in combination, act as a transformer, with one of the first inductor circuit and the second inductor circuit acting as a primary winding of the transformer, and another of the first inductor circuit and the second inductor circuit acting as a secondary winding of the transformer.

Thus, in various embodiments, the semiconductor package 200 includes an inductor arrangement (comprising the first inductor circuit and the second inductor circuit) configured to inductively couple the first die 208a and the second die 208b, and to inductively transmit signals between the first die 208a and the second die 208b, while maintaining electrical isolation between active circuit components of the first die 208a and the active circuit components of the second die 208b.

For example, in various embodiments, an input signal is transmitted between terminals A and A' in the first die 208a (i.e., transmitted through the first inductor circuit comprising the bond wire 220a, the interconnect 224b and the bond wire 220d). The input signal may be a relatively high frequency signal (e.g., with narrow pulse width, with high frequency modulation, and/or the like). Because of the mutual inductance between the first inductor circuit and the second inductor circuit, an output signal is generated (e.g., induced) in the second inductor circuit (e.g., generated or induced in the bond wires 220b and/or 220c) based at least in part on the input signal being transmitted in the first inductor circuit (e.g., transmitted in bond wires 220a and/or 220d). The output signal is representative of the input signal (e.g., proportional to the input signal), and is received across terminals B and B'. Thus, the input signal is inductively transmitted from the first die 208a to the second die 208b, while maintaining electrical isolation between the active circuit components of the first die 208a and the active circuit components of the second die 208b. In various embodiments, such inductive coupling of the two dies 208a and 208b, while maintaining electrical isolation between the active circuit components of the two dies 208a and 208b, allows the two dies 208a and 208b to operate at different voltage levels with respect to each other. For example, a voltage level of the signal handled by the first die 208a may be different (e.g., relatively higher) than a voltage level of the signal handled by the second die 208b.

The second die 208b can also transmit a signal to the first die 208a through the inductive arrangement. For example, an input signal is transmitted between terminals B and B' in the second die 208a (i.e., transmitted through the second inductor circuit comprising the bond wire 220b, the interconnect 224a and the bond wire 220c). The input signal may be a relatively high frequency signal. Because of the mutual inductance between the first inductor circuit and the second inductor circuit, an output signal is generated (e.g., induced) in the first inductor circuit (e.g., generated or induced in bond wires 220a and/or 220d) based at least in part on the input signal being transmitted in the second inductor circuit (e.g., transmitted in the bond wires 220b and/or 220c). The output signal is representative of the input signal (e.g., proportional to the input signal), and is received across terminals A and A'. Thus, the input signal is inductively transmitted from the second die 208b to the first die 208a, while maintaining electrical isolation between the active circuit components of the first die 208a and the active circuit components of the second die 208b.

Bi-directional signal transmission (e.g., signal transmission from the first die 208a to the second die 208b, and from the second die 208b to the first die 208a) can also be achieved using the inductor arrangement of FIG. 2. Such bi-directional signal transmission can be achieved using, for example, time division multiplexing. For example, during a first plurality of time slots, signals are transmitted from the first die 208a to the second die 208b, and during a second plurality of time slots signals are transmitted from the second die 208b to the first die 208a, where the second plurality of time slots are interleaved with the first plurality of time slots.

Bi-directional signal transmission can also be achieved, for example, by appropriately modulating signals using different frequencies. For example, a first signal having a first frequency may be transmitted from the first die 208a to the second die 208b, while a second signal having a second frequency (which is different from the first frequency) may be transmitted from the second die 208b to the first die 208a. As the frequencies of the first signal and the second signal are different, the two signals may be transmitted substantially simultaneously (or at least in an overlapping manner), resulting in substantially simultaneous bi-directional signal transmission between the first die 208a and the second die 208b.

In various embodiments, signals transmitted between the two dies 208a and 208b are parity protected, so that any error originating during the inductive transfer of signals between the dies 208a and 208b can be corrected at a later stage. The inductance between the two inductor circuits may be relatively low. To overcome effects of such low inductance, relatively high frequency signals (e.g., with narrow pulse width, with high frequency modulation, and/or the like) may be transmitted between the two dies 208a and 208b.

Although only four bond wires 220a, . . . , 220d are illustrated to form the inductor arrangement in FIG. 2, in various other embodiments, any other number of bond wires (e.g., two, six, eight, or the like) may also be used to form an inductor arrangement to inductively transmit signals between the first die 208a and the second die 208b, while maintaining electrical isolation between the active circuit components of the first die 208a and the active circuit components of the second die 208b.

As previously noted herein, the bond wire 220a is placed proximally to the bond wire 220b, and the bond wire 220c is placed proximally to the bond wire 220d. For example, bond wires 220a and 220b may be placed sufficiently close such that signals in any one of the bond wires 220a and 220b may have an inductive effect in another of the bond wires 220a and 220b (e.g., generate or induce current in another of the bond wires). Similarly, bond wires 220c and 220d may be placed sufficiently close such that signals in any one of the bond wires 220c and 220d may have an inductive effect in another of the bond wires 220c and 220d.

If the bond wires 220a and 220b (and/or bond wires 220c and 220d) are located too close to each other, there may be an electrical breakdown between the bond wires 220a and 220b (and/or bond wires 220c and 220d). However, as the bond wires 220a, . . . , 220d (as well as the dies 208a and 208b) are molded in a package mold (which may be, for example, a plastic enclosure) having relatively high electrical insulating properties, the breakdown voltage between the bond wires 220a and 220b (and/or bond wires 220c and 220d) increases, thereby allowing the bond wires 220a and 220b (and/or bond wires 220c and 220d) to be located sufficiently close to each other such that one of the bond wires has an inductive effect on the other.

Figure 5A:
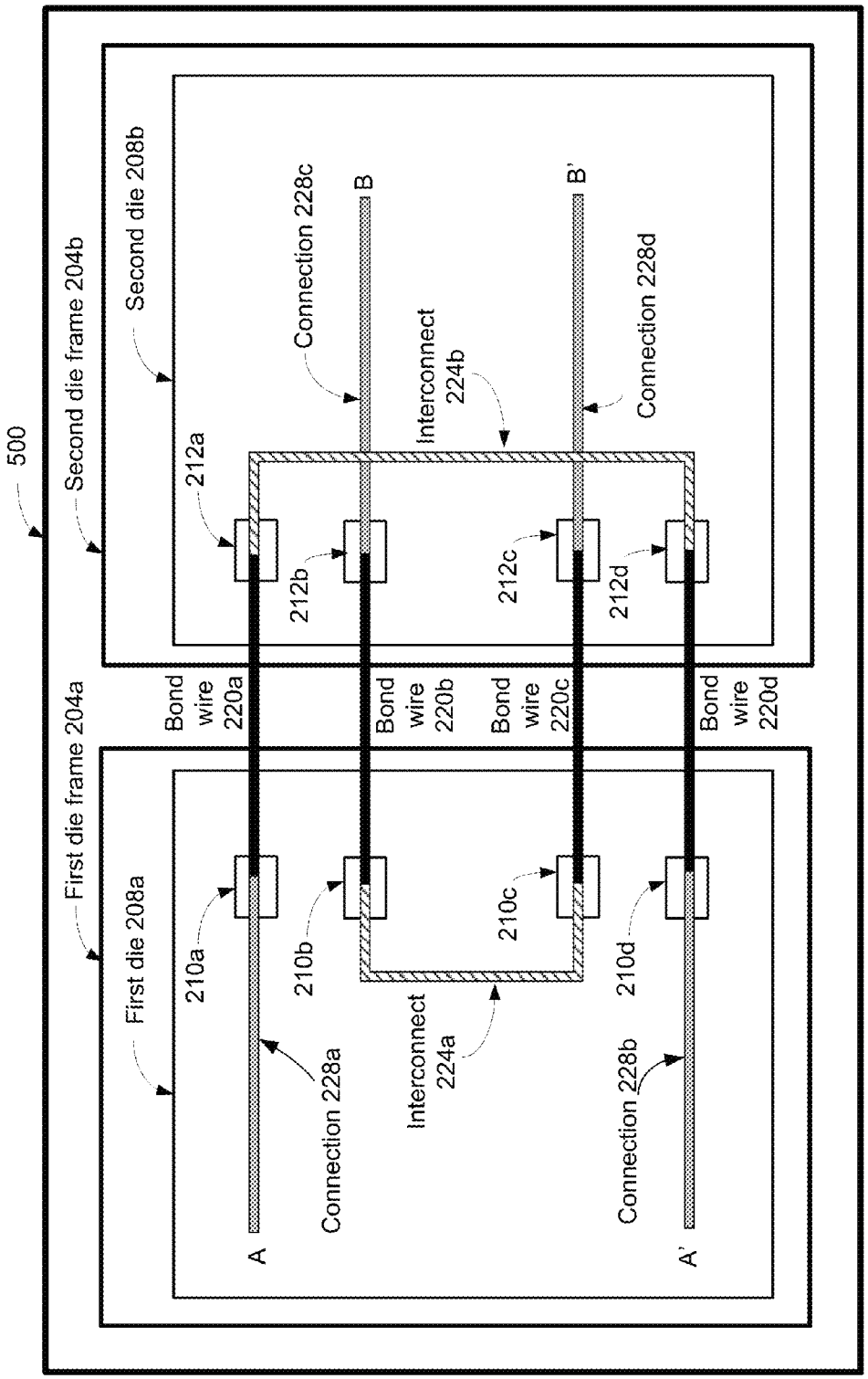
FIGS. 5A-5B schematically illustrate respective semiconductor packages in which two dies are attached to two different die frames, in accordance with various embodiments of the present disclosure.

In FIG. 2, the dies 208a and 208b are attached to a single die frame 204. However, in various other embodiments, the dies 208a and 208b may be attached to different die frames. FIG. 5A schematically illustrates a semiconductor package 500 in which two dies are attached to two different die frames, in accordance with various embodiments of the present disclosure. Various components of the semiconductor package 500 of FIG. 5A are at least in part similar to the respective components of the semiconductor package 200 of FIG. 2. However, unlike the semiconductor package 200 (where the dies 208a and 208b are attached to a single die frame 204), the semiconductor package 500 includes a first die frame 204a and a second die frame 204b. The first die 208a and the second die 208b are attached to the respective die frames 204a and 204b.

In the semiconductor package 500, as the two dies 208a and 208b are attached to separate die frames, the two dies 208a and 208b cannot be electrically coupled through a common die frame. Accordingly, in various embodiments, one or both of the dies 208a and 208b may be attached to the respective die frames 204a and 204b using a thermally and/or electrically conductive glue layer (e.g., in a manner similar to the way the first die 208a is attached to the die frame 204 in FIG. 4).

Figure 5B:
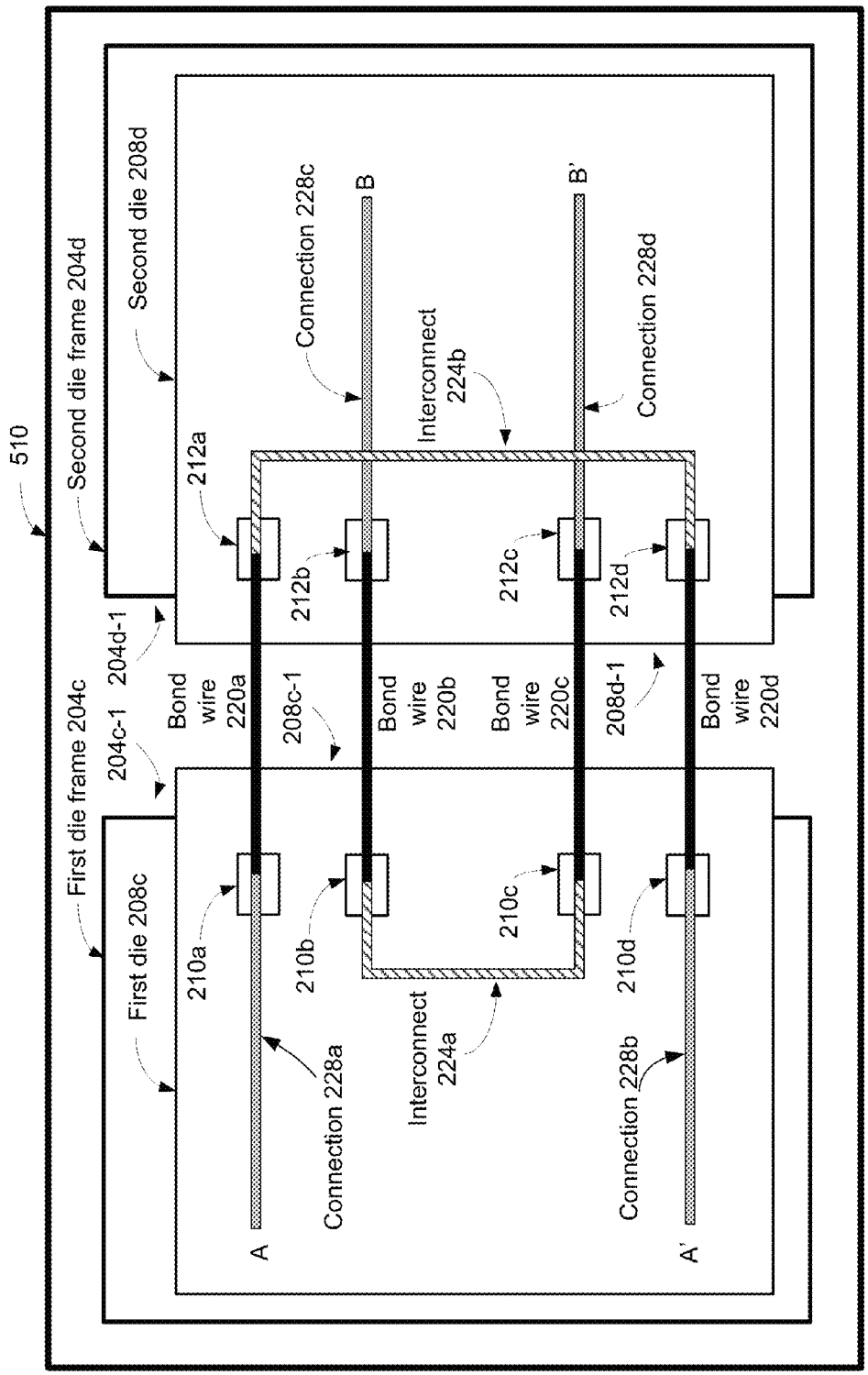

FIG. 5B illustrates another semiconductor package 510 in which an edge 204c-1 of a first die frame 204c is inside of an edge 208c-1 of a first die 208c. In other words, the edge 204c-1 does not extend beyond the edge 208c-1. Similarly, an edge 204d-1 of a second die frame 204d is also inside of an edge 208d-1 of a second die 208d. By having the edges 204c-1 and 204d-1 of the first and second die frames 204c and 204d behind the respective edges 208c-1 and 208d-1 of the first and second dies 208c and 208d, the first and second dies 208c and 208d can be moved closer to each other vis-à-vis the first and second dies 208a and 208b as shown in FIG. 5A, thereby shortening the lengths of the bond wires 220a-d therebetween. Based on the disclosure and teachings provided herein, it should be understood that, in other embodiments, the edge of a first die frame may be located behind the edge of a corresponding first die, while the edge of a second die frame may be located beyond the edge of a corresponding second die.

Figure 6A:
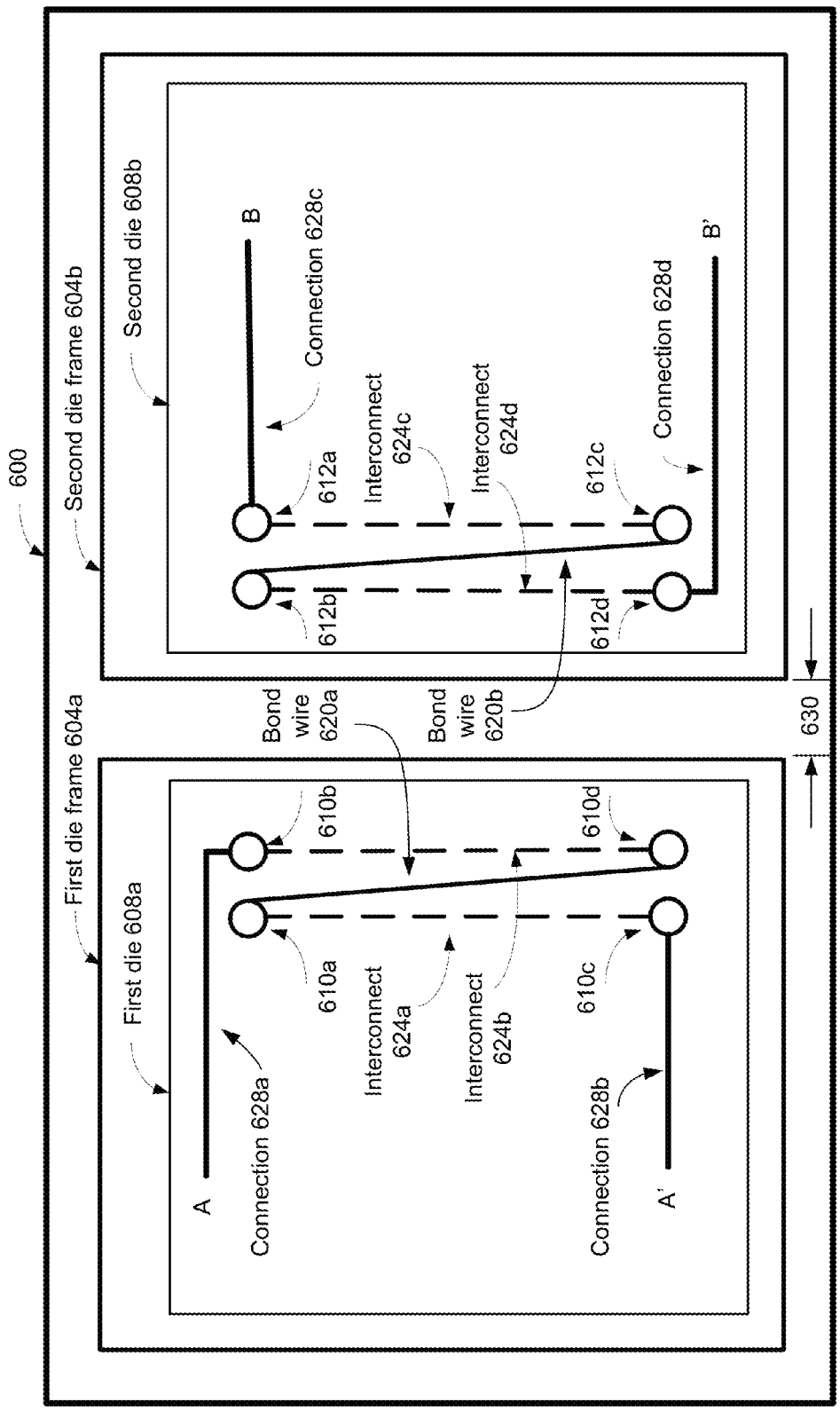
FIGS. 6A-6C schematically illustrate respective semiconductor packages in which no bond wires are used between two dies attached to two different die frames, in accordance with various embodiments of the present disclosure.

FIG. 6A illustrates a semiconductor package 600 in which no bond wires are used to physically connect a first die 608a and a second die 608b, in accordance with various embodiments. The first die frame 604a and the second die frame 604b are separated by a gap 630 which provides electrical isolation. The first die frame 604a includes the first die 608a. The first die 608a further includes terminals A and A'. There is a circuit or signal path between terminals A and A' formed by connection 628a, connector 610b, interconnect 624b, connector 610d, bond wire 620a, connector 610a, interconnect 624a, connector 610c and connection 628b. The connections 628a, 628b, the connectors 610a, 610b, 610c, 610d, the interconnect 624a, 624b and the bond wire 620a are similar to those elements as shown in FIGS. 2 and 5. The bond wire 620a is generally disposed above a surface of the first die 608a with its two ends connected to connectors 610a, 610d. In one configuration, the bond wire 620a forms a half-loop between connectors 610a and 610d. The second die 608b includes elements that are similar to those of the first die 608a. Similarly, there is also a circuit or signal path between terminals B and B'. The respective circuit paths between terminals A and A' and B and B' effectively constitute an inductor arrangement that inductively or magnetically couples the first and second dies 608a, 608b. When a signal is transmitted along one circuit path, a corresponding signal is inductively created in the other circuit path, and vice versa, thereby allowing the first die 608a and the second die 608b to communicate.

Figure 6B:
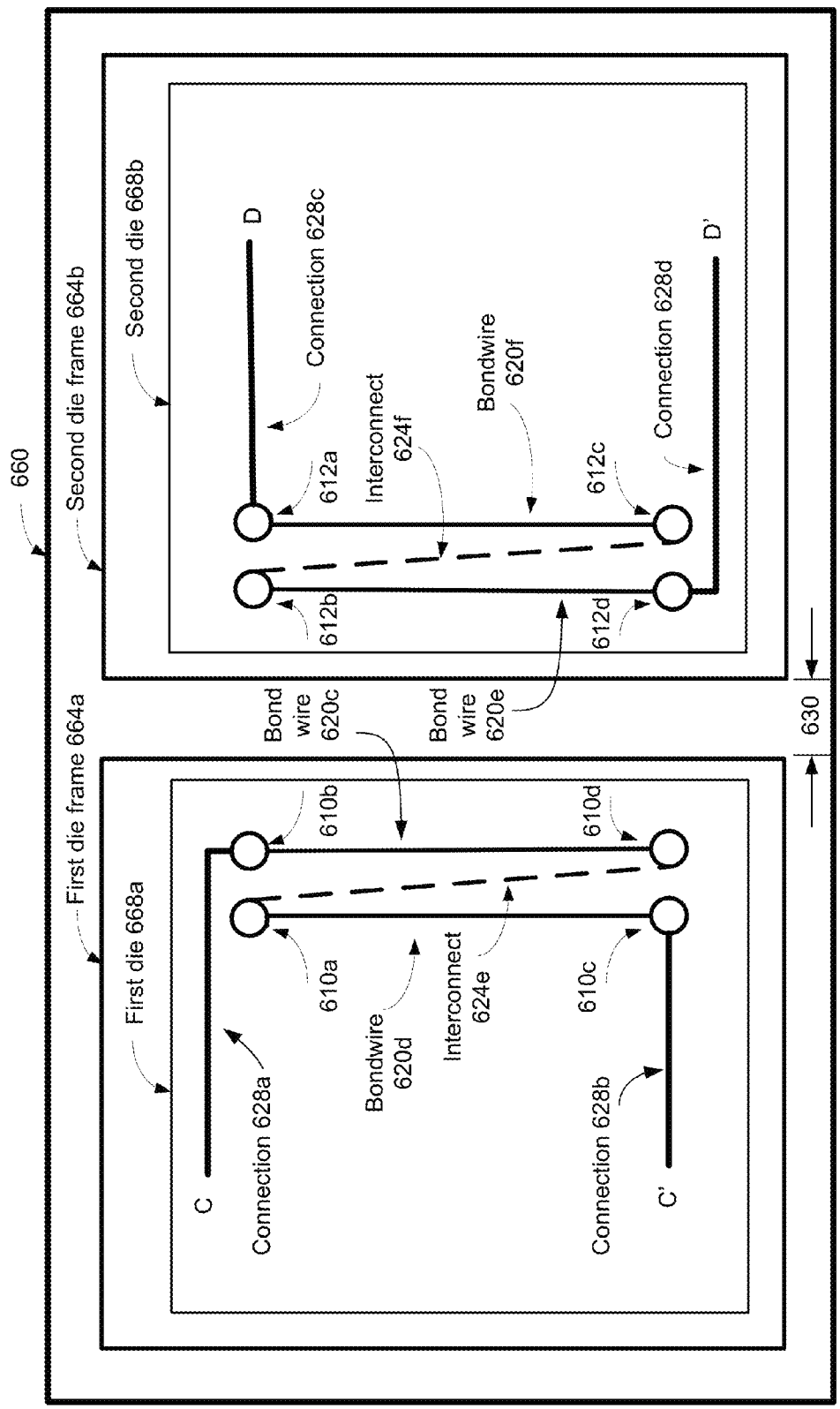

FIG. 6B illustrates another semiconductor package 660 in which no bond wires are used to physically connect a first die 668a and a second die 668b, in accordance with various embodiments. The first die frame 664a and the second die frame 664b are similar to the first die frame 604a and the second die frame 604b as shown in FIG. 6A. Similar to the first die frame 604a as shown in FIG. 6A, the first die frame 664a includes the first die 668a. The first die 668a further includes terminals C and C'. There is a circuit or signal path between terminals C and C' formed by connection 628a, connector 610b, bond wire 620c, connector 610d, interconnect 624e, connector 610a, bond wire 620d, connector 610c and connection 628b. The bond wires 620c, 620d are generally disposed above a surface of the first die 668a with their two ends connected to connectors 610b, 610d and 610a, 610c respectively. In one configuration, the bond wires 620c and 620d each form a half-loop between connectors 610b, 610d and connectors 610a, 610c respectively. The second die 668b includes elements that are similar to those of the first die 668a. Similarly, there is also a circuit or signal path between terminals D and D'. The respective circuit paths between terminals C and C' and D and D' effectively constitute an inductor arrangement that inductively or magnetically couples the first and second dies 668a, 668b. When a signal is transmitted along one circuit path, a corresponding signal is inductively created in the other circuit path, and vice versa, thereby allowing the first die 668a and the second die 668b to communicate. Based on the disclosure and teachings provided herein, it should be noted that the number of bond wires and interconnects used in a die may vary depending on particular designs and/or applications.

Figure 6C:
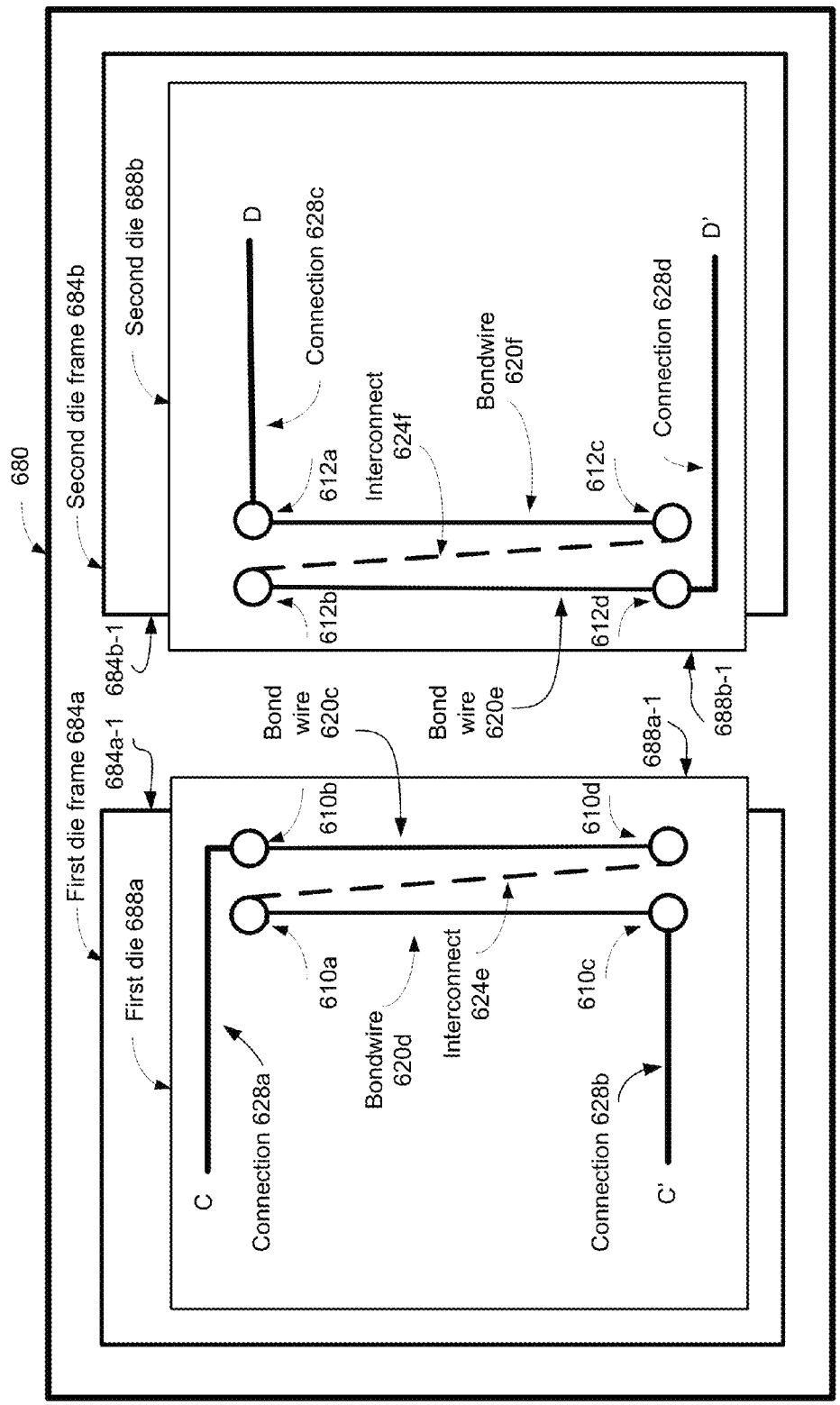

FIG. 6C illustrates a semiconductor package 680 which is similar to that shown in FIG. 6B, except that edges 684a-1, 684b-1 of first and second die frames 684a, 684b are inside of edges 688a-1, 688b-1 of first and second dies 688a, 688b respectively. The edge locations of the semiconductor package 680 are similar to those of the semiconductor package 510 as shown in FIG. 5B. By having the edges 684a-1 and 684b-1 of the first and second die frames 684a and 684b behind the respective edges 688a-1 and 688b-1 of the first and second dies 688a and 688b, the first and second dies 688a and 688b can be moved closer to each other vis-à-vis the first and second dies 668a and 668b as shown in FIG. 6B, thereby allowing the bond wires 620c-f to be closer as well. By having the bond wires 620c-f closer, higher inductive or magnetic coupling can be achieved. Based on the disclosure and teachings provided herein, it should be understood that the distance between the first and second dies 688a and 688b may vary depending on a particular design or application.

Figure 7:
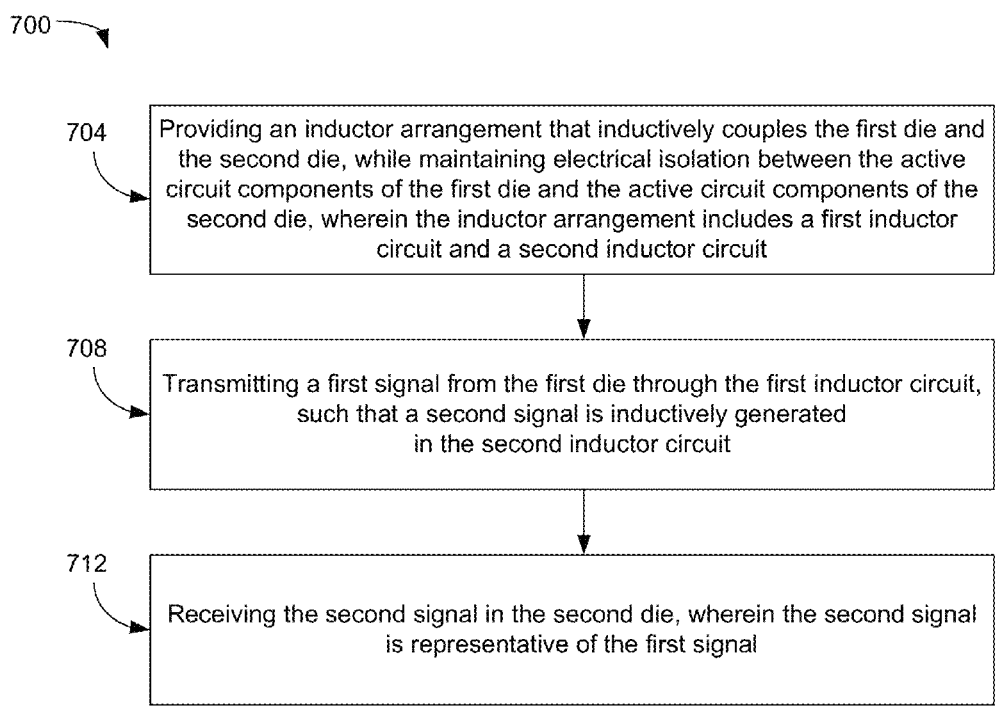
FIG. 7 illustrates a method for transmitting signals between a first die and a second die included in a semiconductor package, in accordance with various embodiments of the present disclosure.

FIG. 7 illustrates a method 700 for transmitting signals between a first die (e.g., first die 208a) and a second die (e.g., second die 208b) included in a semiconductor package (e.g., semiconductor package 200 and/or 500). The method 700 includes, at 704, providing an inductor arrangement that inductively couples the first die 208a and the second die 208b, while maintaining electrical isolation between the active circuit components of the first die 208a and the active circuit components of the second die 208b, where the inductor arrangement includes a first inductor circuit and a second inductor circuit. For example, as previously described, bond wires 220a and 220d, and interconnect 224b form the first inductor circuit. Bond wires 220b and 220c, and interconnect 224a form the second inductor circuit.

The method further comprises, at 708, transmitting a first signal from the first die 208a (e.g., from terminals A and A') through the first inductor circuit, such that a second signal is inductively generated in the second inductor circuit. Generation of the second signal is based on transformer action between the first inductor circuit and the second inductor circuit.

The method further comprises, at 712, receiving the second signal in the second die 208b (e.g., in terminals B and B' of the second die 208b), where the second signal is representative (e.g., proportional) of the first signal. Thus, the first signal is transmitted from the first die 208a, through the inductor arrangement, to the second die 208b in the form of the second signal (as the second signal is representative of the first signal).

Figure 8:
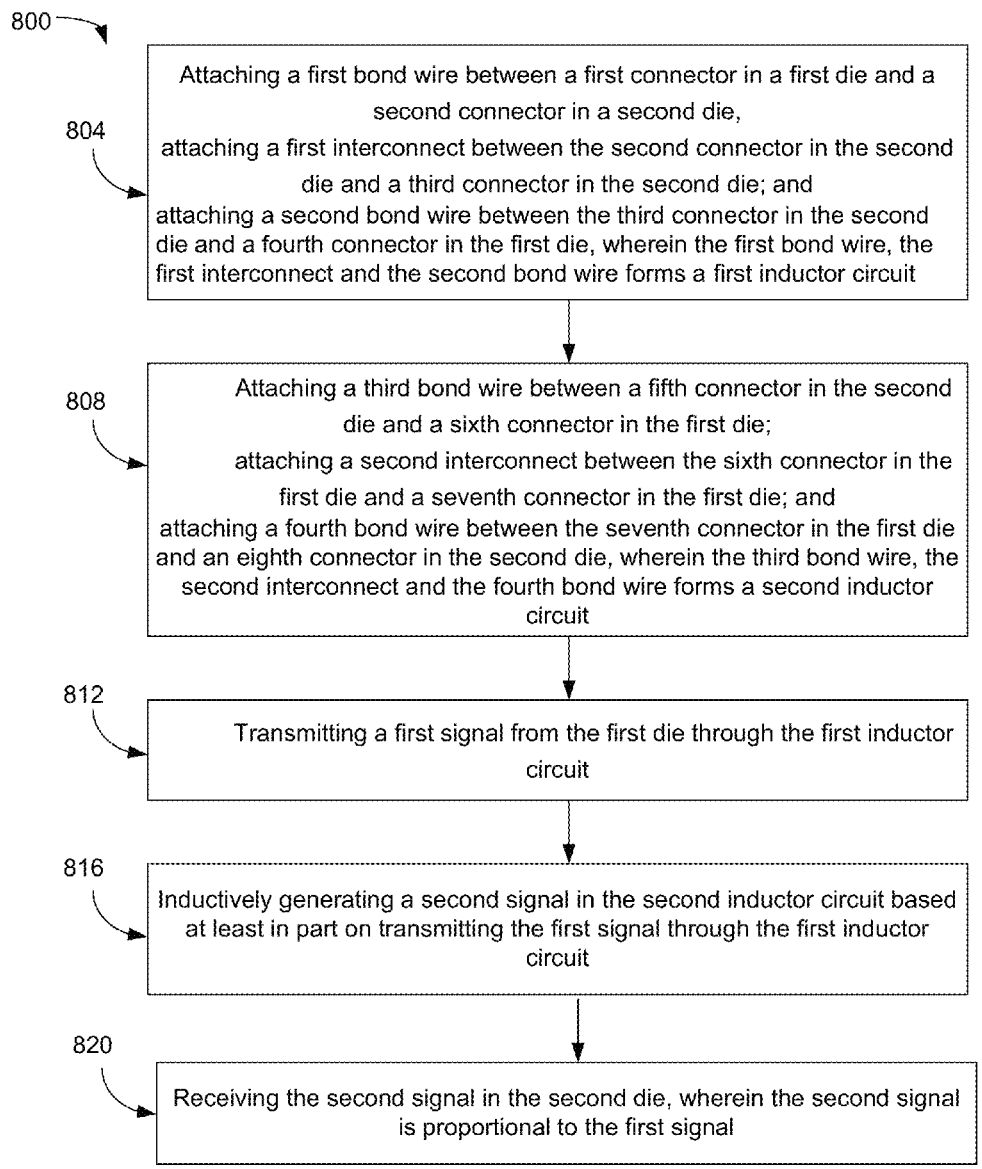
FIG. 8 illustrates another method for transmitting signals between a first die and a second die included in a semiconductor package, in accordance with various embodiments of the present disclosure.

FIG. 8 illustrates a method 800 for transmitting signals between a first die (e.g., first die 208a) and a second die (e.g., second die 208b) included in a semiconductor package (e.g., semiconductor package 200 and/or 500). The method 800 includes, at 804, attaching a first bond wire (e.g., bond wire 220a) between a first connector (e.g., connector 210a) in the first die 208a and a second connector (e.g., connector 212a) in the second die 208b, attaching a first interconnect (e.g., interconnect 224b) between the second connector 212a and a third connector (e.g., connector 212d) in the second die 208b, and attaching a second bond wire (e.g., bond wire 220d) between the third connector 212d and a fourth connector (e.g., connector 210d) in the first die 208a. The second connector 212a, the third connector 212d and the first interconnect 224b are electrically isolated from active circuit components of the second die 208b.

The method further comprises, at 808, attaching a third bond wire (e.g., bond wire 220b) between a fifth connector (e.g., connector 212b) in the second die 708b and a sixth connector (e.g., connector 210b) in the first die 208a, attaching a second interconnect (e.g., interconnect 224a) between the sixth connector 210b and a seventh connector (e.g., connector 210c) in the first die 208a, and attaching a fourth bond wire (e.g., bond wire 220c) between the seventh connector 210c and an eighth connector (e.g., connector 212c) in the second die 208b. The sixth connector 210b, the seventh connector 210c and the second interconnect 224a are electrically isolated from active circuit components of the first die 208a, as previously described. The third bond wire 220b, the second interconnect 224a and the fourth bond wire 220c form a second inductor circuit.

The method further comprises, at 812, transmitting a first signal from the first die 208a through the first inductor circuit (e.g., from terminals A and A'). The method further comprises, at 816, inductively generating a second signal in the second inductor circuit based at least in part on transmitting the first signal through the first inductor circuit. Generation of the second signal is based on transformer action between the first inductor circuit and the second inductor circuit. The method further comprises, at 820, receiving the second signal in the second die 208b (e.g., in terminals B and B' of the second die 208b), where the second signal is representative (e.g., proportional) of the first signal. Thus, the first signal is transmitted from the first die 208a, through the first inductor circuit and the second inductor circuit, to the second die 208b in the form of the second signal (as the second signal is representative of the first signal).

Figure 9:
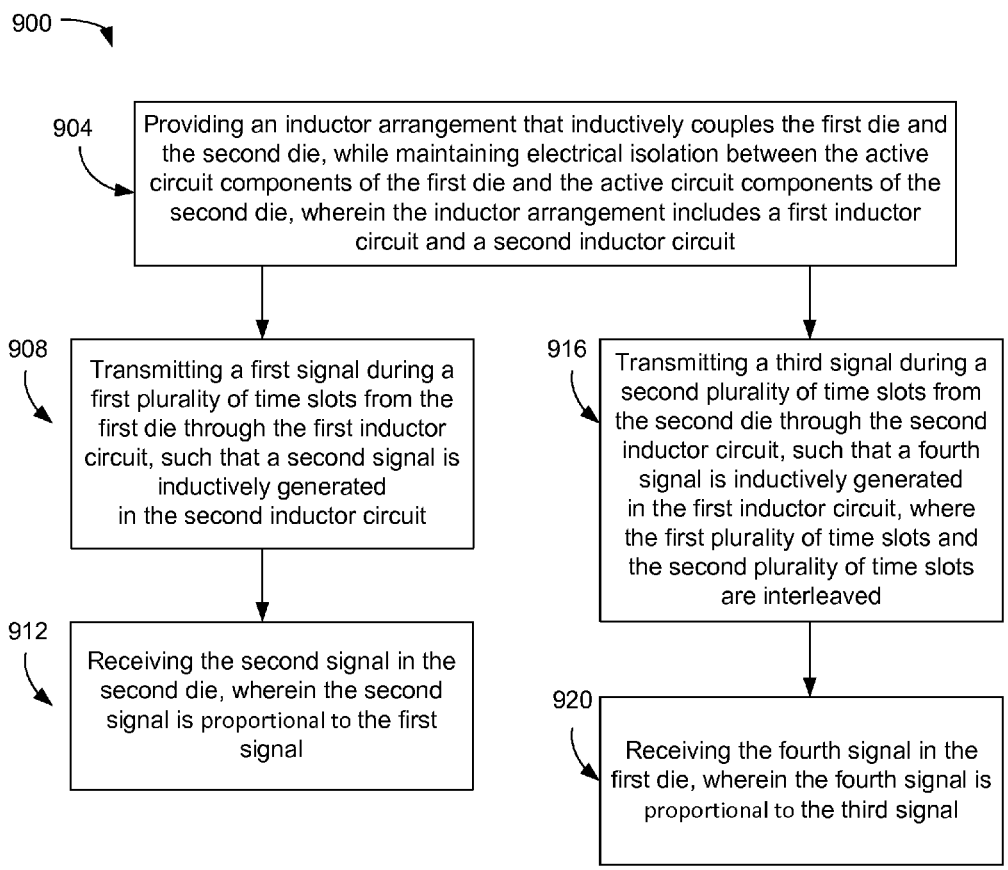
FIGS. 9 and 10 illustrate two methods for transmitting signals between a first die and a second die included in a semiconductor package, in accordance with various embodiments of the present disclosure.

FIG. 9 illustrates a method 900 for transmitting signals between a first die (e.g., first die 208a) and a second die (e.g., second die 208b) included in a semiconductor package (e.g., semiconductor package 200 and/or 500). The method 900 includes, at 904, providing an inductor arrangement that inductively couples the first die 208a and the second die 208b, while maintaining electrical isolation between the active circuit components of the first die 208a and the active circuit components of the second die 208b, where the inductor arrangement includes a first inductor circuit and a second inductor circuit. The method further comprises, at 908, transmitting a first signal during a first plurality of time slots from the first die 208a (e.g., from terminals A and A') through the first inductor circuit, such that a second signal is inductively generated in the second inductor circuit. The method further comprises, at 912, receiving the second signal in the second die 208b (e.g., in terminals B and B' of the second die 208b), where the second signal is proportional to the first signal. The method further comprises, at 916, transmitting a third signal during a second plurality of time slots from the second die through the second inductor circuit, such that a fourth signal is inductively generated in the first inductor circuit, where the first plurality of time slots and the second plurality of time slots are interleaved. The method further comprises, at 920, receiving the fourth signal in the first die, wherein the fourth signal is proportional to the third signal.

Figure 10:
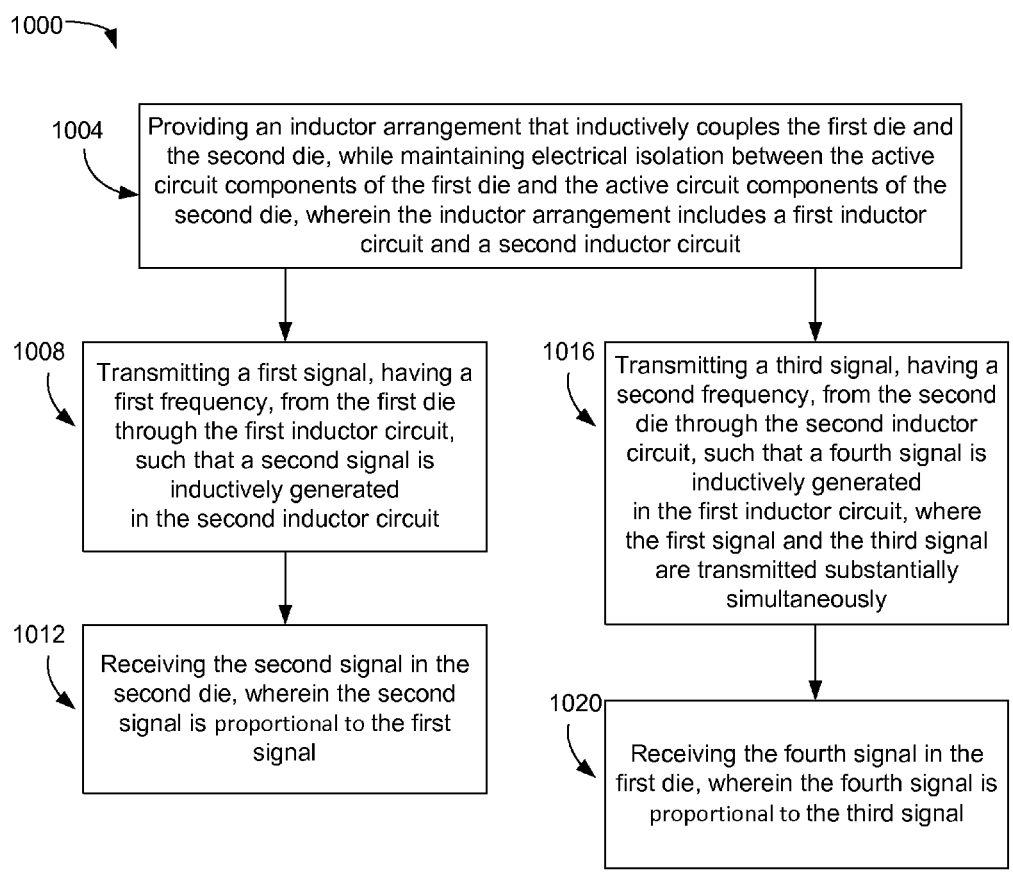

FIG. 10 illustrates a method 1000 for transmitting signals between a first die (e.g., first die 208a) and a second die (e.g., second die 208b) included in a semiconductor package (e.g., semiconductor package 200 and/or 500). The method 1000 includes, at 1004, providing an inductor arrangement that inductively couples the first die 208a and the second die 208b, while maintaining electrical isolation between the active circuit components of the first die 208a and the active circuit components of the second die 208b, where the inductor arrangement includes a first inductor circuit and a second inductor circuit. The method further comprises, at 1008, transmitting a first signal, having a first frequency, from the first die through the first inductor circuit, such that a second signal is inductively generated in the second inductor circuit. The method further comprises, at 1012, receiving the second signal in the second die, wherein the second signal is proportional to the first signal. The method further comprises, at 1016, transmitting a third signal, having a second frequency, from the second die through the second inductor circuit, such that a fourth signal is inductively generated in the first inductor circuit, where the first signal and the third signal are transmitted substantially simultaneously. The method further comprises, at 1020, receiving the fourth signal in the first die, wherein the fourth signal is proportional to the third signal.

Although specific embodiments have been illustrated and described herein, it will be appreciated by those of ordinary skill in the art and others, that a wide variety of alternate and/or equivalent implementations may be substituted for the specific embodiment illustrated and described without departing from the scope of the present invention. This present invention covers all methods, apparatus, and articles of manufacture fairly falling within the scope of the appended claims either literally or under the doctrine of equivalents. This application is intended to cover any adaptations or variations of the embodiments discussed herein. Therefore, it is manifested and intended that the invention be limited only by the claims and the equivalents thereof.

What is claimed is:

1. A semiconductor package comprising:
   a first die;
   a second die; and
   an inductor arrangement configured to inductively couple the first die and the second die while maintaining electrical isolation between active circuit components of the first die and active circuit components of the second die,
   wherein the inductor arrangement includes (i) a first inductor circuit of the first die and (ii) a second inductor circuit of the second die,
   wherein the first inductor circuit comprises:
      a first bond wire electrically coupled between (i) a first connector of the first die and (ii) a second connector of the second die;
      a first interconnect electrically coupled between (i) the second connector of the second die and (ii) a third connector of the second die, wherein the second connector, the third connector and the first interconnect are electrically isolated from the active circuit components of the second die; and a second bond wire electrically coupled between (i) the third connector of the second die and (ii) a fourth connector of the first die, and wherein the second inductor circuit comprises:

a third bond wire electrically coupled between (i) a fifth connector of the second die and (ii) a sixth connector of the first die;

a second interconnect electrically coupled between (i) the sixth connector of the first die and (ii) a seventh connector of the first die, wherein the sixth connector, the seventh connector and the second interconnect are electrically isolated from the active circuit components of the first die; and a fourth bond wire electrically coupled between (i) the seventh connector of the first die and (ii) an eighth connector of the second die, wherein the inductor arrangement is configured to inductively transmit signals between the first inductor circuit of the first die and the second inductor circuit of the second die, wherein the first inductor circuit of the first die is configured to operate as a primary coil of a transformer, and wherein the second inductor circuit of the second die is configured to operate as a secondary coil of the transformer.

2. The semiconductor package of claim 1, further comprising an insulating layer formed between the first interconnect of the first inductor circuit and the active circuit components of the second die.

3. The semiconductor package of claim 1, wherein:

the first die is configured to transmit a first signal through the first inductor circuit such that a second signal is inductively generated in the second inductor circuit of the second die in response to a first operation;

the second signal generated in the second inductor circuit of the second die is proportional to the first signal transmitted through the first inductor circuit of the first die; and the second die is configured to receive the second signal.

4. The semiconductor package of claim 3, wherein:

the second die is configured to transmit a third signal through the second inductor circuit such that a fourth signal is inductively generated in the first inductor circuit of the first die in response to a second operation;

the fourth signal generated in the first inductor circuit of the first die is proportional to the third signal transmitted through the second inductor circuit of the second die; and the first die is configured to receive the fourth signal.

5. The semiconductor package of claim 4, wherein:

the first signal is transmitted during a first plurality of time slots during the first operation;

the third signal is transmitted during a second plurality of time slots during the second operation; and the first plurality of time slots and the second plurality of time slots are interleaved using time division multiplexing.

6. The semiconductor package of claim 4, wherein:

the first signal is transmitted through the first inductor circuit of the first die and the third signal is transmitted through the second inductor circuit of the second die substantially simultaneously; and a first frequency of the first signal transmitted through the first inductor circuit of the first die is different from a second frequency of the third signal transmitted through the second inductor circuit of the second die.

7. The semiconductor package of claim 3, wherein a first voltage level of the first signal transmitted through the first inductor circuit of the first die is different from a second voltage level of the second signal generated in the second inductor circuit of the second die.

8. The semiconductor package of claim 1, wherein the first die and the second die operate at different voltage levels.

9. The semiconductor package of claim 1, further comprising:

a die frame, wherein the first die is attached to the die frame using electrically conductive glue such that the first die is electrically coupled to the die frame with the electrically conductive glue, and wherein the second die is indirectly coupled to the die frame through an intermediary electrical isolation layer such that the second die is electrically isolated from the die frame.

10. The semiconductor package of claim 1, further comprising:

a first die frame, wherein the first die is directly attached to the first die frame with conductive adhesive or indirectly coupled to the first die frame via an intermediary insulation layer; and a second die frame, wherein the second die is directly attached to the second die frame with a conductive adhesive or indirectly coupled to the second die frame via an intermediary insulation layer.

11. A method of transmitting signals between a first die and a second die included in a semiconductor package, the method comprising:

providing an inductor arrangement that inductively couples the first die and the second die, while maintaining electrical isolation between active circuit components of the first die and active circuit components of the second die, wherein the inductor arrangement includes (i) a first inductor circuit of the first die, and (ii) a second inductor circuit of the second die;

transmitting a first signal through the first inductor circuit of the first die such that a second signal is inductively generated in the second inductor circuit of the second die, wherein the second signal is representative of the first signal, wherein the first inductor circuit comprises:

a first bond wire electrically coupled between (i) a first connector of the first die and (ii) a second connector of the second die;

a first interconnect electrically coupled between (i) the second connector of the second die and (ii) a third connector of the second die, wherein the second connector, the third connector and the first interconnect are electrically isolated from the active circuit components of the second die; and a second bond wire electrically coupled between (i) the third connector of the second die and (ii) a fourth connector of the first die, and wherein the second inductor circuit comprises:

a third bond wire electrically coupled between (i) a fifth connector of the second die and (ii) a sixth connector of the first die;

a second interconnect electrically coupled between (i) the sixth connector of the first die and (ii) a seventh connector of the first die, wherein the sixth connector, the seventh connector and the second interconnect are electrically isolated from the active circuit components of the first die; and a fourth bond wire electrically coupled between (i) the seventh connector of the first die and (ii) an eighth connector of the second die.

12. The method of claim 11, further comprising:

transmitting a third signal through the second inductor circuit of the second die such that a fourth signal is inductively generated in the first inductor circuit of the first die, wherein the fourth signal is representative of the third signal.

13. The method of claim 12, wherein:

the first signal is transmitted during a first plurality of time slots in response to a first operation;

the third signal is transmitted during a second plurality of time slots in response to a second operation; and the first plurality of time slots and the second plurality of time slots are interleaved using time division multiplexing.

14. The method of claim 12, wherein:

the first signal is transmitted through the first inductor circuit of the first die and the third signal is transmitted through the second inductor circuit of the second die substantially simultaneously; and a first frequency of the first signal transmitted through the first inductor circuit of the first die is different from a second frequency of the third signal transmitted through the second inductor circuit of the second die.

15. The method of claim 11, wherein the first signal is a high frequency signal.

16. The method of claim 11, wherein:

the first die is attached to a die frame with an electrically conductive adhesive, and the second die is indirectly coupled to the die frame through an intermediary electrical isolation layer, such that the first die and the second die are electrically isolated from each other.

17. The method of claim 11, wherein:

the first die is directly attached to a first die frame with a conductive adhesive or indirectly coupled to the first die frame via an intermediary insulation layer; and the second die is directly attached to a second die frame with a conductive adhesive or indirectly coupled to the second die frame via an intermediary insulation layer.

18. The method of claim 11, wherein:

the first bond wire and the third bond wire are configured to be inductively coupled during a transformer operation of the inductor arrangement; and the second bond wire and the fourth bond wire are configured to be inductively coupled during the transformer operation of the inductor arrangement.

19. The semiconductor package of claim 1, wherein:

the first bond wire and the third bond wire are configured to be inductively coupled during a transformer operation of the inductor arrangement; and the second bond wire and the fourth bond wire are configured to be inductively coupled during the transformer operation of the inductor arrangement.

20. A semiconductor package comprising:

a first die;

a second die; and an inductor arrangement including a first inductor circuit of the first die and a second inductor circuit of the second die, wherein the inductor arrangement is configured to inductively couple the first inductor circuit of the first die and the second inductor circuit of the second die while maintaining electrical isolation between active circuit components of the first die and active circuit components of the second die, wherein the first inductor circuit of the first die comprises a first bond wire and a second bond wire positioned between the first die and the second die, and a first interconnect configured to couple the first bond wire to the second bond wire, wherein the second inductor circuit of the second die comprises a third bond wire and a fourth bond wire positioned between the first die and the second die, and a second interconnect configured to couple the third bond wire to the fourth bond wire, wherein the first inductor circuit of the first die is configured to operate as a primary coil of a transformer, and wherein the second inductor circuit of the second die is configured to operate as a secondary coil of the transformer.

* * * * *